US006450117B1

(12) United States Patent
Murugesh et al.

(10) Patent No.: US 6,450,117 B1
(45) Date of Patent: Sep. 17, 2002

(54) DIRECTING A FLOW OF GAS IN A SUBSTRATE PROCESSING CHAMBER

(75) Inventors: Laxman Murugesh, Fremont; Padmanaban Krishnaraj, San Francisco; Michael Cox, Davenport; Canfeng Lai, Fremont; Narendra Dubey, Santa Clara; Tom K. Cho, Palo Alto; Sudhir Ram Gondhalekar; Lily L. Pang, both of Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/633,494

(22) Filed: Aug. 7, 2000

(51) Int. Cl.[7] .......................... C23C 16/00; H05H 1/00; H01L 21/00
(52) U.S. Cl. ....................... 118/723 ME; 118/723 IR; 118/723 ER; 156/345.35; 156/345.36; 134/1.1; 438/905
(58) Field of Search ................... 118/723 ME, 723 IR, 118/723 ER, 723 DC, 726; 156/345.35, 345.36; 134/1.1; 438/905

(56) References Cited

U.S. PATENT DOCUMENTS 4,282,267 A    8/1981   Kuyel (List continued on next page.)

FOREIGN PATENT DOCUMENTS

| DE | 4132559.1 A1 | 4/1993 |
|----|--------------|--------|
| EP | 0555546 A1   | 8/1993 |
| EP | 0697467 A1   | 2/1996 |
| EP | 0790635      | 2/1997 |
| JP | 62040728     | 8/1985 |
| WO | 9615545      | 5/1996 |

OTHER PUBLICATIONS

U.S. Patent Application entitled, "Method for Improved Cleaning of Substrate Processing System"; filed Jul. 11, 1997; Serial No. Unknown; Inventors: Kao, et al.; Attorney Docket No. 2027.

(List continued on next page.)

Primary Examiner—Gregory Mills
Assistant Examiner—Parviz Hassanzadeh
(74) Attorney, Agent, or Firm—Janah & Associates

(57) ABSTRACT

A substrate processing chamber 30 comprising a first gas distributor 65 adapted to provide a process gas into the chamber 30 to process the substrate 25, a second gas distributor 215 adapted to provide a cleaning gas into the chamber 30 to clean the chamber, and an exhaust 90 to exhaust the process gas or cleaning gas from the chamber 30.

61 Claims, 4 Drawing Sheets

U.S. PATENT DOCUMENTS

| | | | |
|---|---|---|---|
| 4,433,228 A | | 2/1984 | Nishimatsu et al. |
| 4,576,692 A | | 3/1986 | Fukuta et al. |
| 4,738,748 A | | 4/1988 | Kisa |
| 4,818,326 A | | 4/1989 | Liu et al. |
| 4,831,963 A | | 5/1989 | Saito et al. |
| 4,863,561 A | | 9/1989 | Freeman et al. |
| 4,867,841 A | | 9/1989 | Loewenstein et al. |
| 5,002,632 A | | 3/1991 | Loewensrein et al. |
| 5,010,842 A | * | 4/1991 | Oda et al. ............ 118/723 ME |
| 5,084,126 A | | 1/1992 | McKee |
| 5,158,644 A | | 10/1992 | Cheung et al. |
| 5,282,899 A | | 2/1994 | Balmashov et al. |
| 5,312,519 A | | 5/1994 | Sakai et al. |
| 5,356,478 A | | 10/1994 | Chen et al. |
| 5,382,316 A | | 1/1995 | Hills et al. |
| 5,389,197 A | | 2/1995 | Ishimaru |
| 5,413,954 A | | 5/1995 | Aydil et al. |
| 5,449,411 A | | 9/1995 | Fukuda et al. |
| 5,637,237 A | | 6/1997 | Oehrlein et al. |
| 5,772,771 A | | 6/1998 | Li et al. |
| 5,976,993 A | | 11/1999 | Davi et al. |
| 6,085,690 A | * | 7/2000 | Mizuno .................. 118/723 E |

OTHER PUBLICATIONS

U.S. Patent Application entitled, "Apparatus for Improved Remote Microwave Plasma source for Use with Substrate Processing Systems"; filed Apr. 23, 1997; Serial No. 08/839,111; Inventors: Kao, et al.; Attorney Docket No. 1975.

U.S. Patent Application entitled, "Method and Apparatus for Determining the Endpoint in a Plasma Cleaning Process"; filed Jul. 2, 1997; Serial No. 08/887,165; Inventors: Subrahmanyam, et al.; Attorney Docket No. 1852.

U.S. Patent Application entitled, "Apparatus and Method for Efficient and Compact Remote Microwave Plasma Generation"; filed Apr. 22, 1997; Serial No. 08/839,077; Inventor: Bhatnagar; Attorney Docket No. 1772.

U.S. Patent Application entitled, "Method and Apparatus for Pre–stabilized Plasma Generation for Microwave Clean Applications"; filed Nov. 13, 1996; Serial No.08/746,658; Inventors: Fong, et al.; Attorney Docket No. 1680–14.

U.S. Patent Application entitled, "Inductively Coupled HDP–CVD Reactor"; filed May 29, 1997; Serial No. 08/865,018; Inventors: Redeker, et al.; Attorney Docket No. 1570–02.

U.S. Patent Application entitled, "Symmetric Tunable Inductively Coupled HDP–CVD Reactor"; filed Jul. 15, 1996; Serial No. 08/679,927; Inventors: Redeker, et al.; Attorney Docket No. 1570.

U.S. Patent Application entitled, "Apparatus and Method for Upgraded Substrate Processing System with Microwave Plasma Source"; filed Mar. 5, 1997; Serial No. 08/811,627; Inventors: Tanaka, et al.; Attorney Docket No. 1480.

U.S. Patent Application entitled, "Microwave Apparatus for In–situ Vacuum Line cleaning for Substrate Processing Equipment"; filed Oct. 30, 1996; Serial No. 08/741,241; Inventors: Pang, et al.; Attorney Docket No. 1529.

* cited by examiner

DIRECTING A FLOW OF GAS IN A SUBSTRATE PROCESSING CHAMBER

BACKGROUND

The present invention relates to directing a gas flow in a substrate processing chamber.

In the fabrication of active and passive electronic devices, semiconductor, dielectric, and conductor materials, such as for example, polysilicon, silicon dioxide, aluminum or tungsten silicide, are formed on a substrate by, for example, chemical vapor deposition (CVD), physical vapor deposition (PVD), oxidation and nitridation processes. In CVD processes, a reactive gas is used to deposit material on the substrate, and in PVD processes, a target is sputtered to deposit material on the substrate. In oxidation and nitridation processes, an oxide or nitride material, for example, silicon dioxide or silicon nitride, respectively, is formed on the substrate by exposing the substrate to a suitable gaseous environment. In subsequent processes, a patterned mask of photoresist or hard mask is formed on the substrate by photolithographic methods, and the exposed portions of the substrate are etched by an energized gas to form patterns of gates, vias, contact holes or interconnect lines.

In such processes, process residues may deposit on the surfaces of walls and other components in the chamber. The composition of the process residues may depend upon the composition of the process gas, the material being deposited or etched, and the composition of material on the substrate. These residues have to be periodically cleaned off from the chamber surfaces to reduce or prevent contamination of the substrate. The chamber may be cleaned by a wet-cleaning process in which the chamber is shut down and an operator scrubs the chamber walls with an acid or solvent. However, the chamber downtime that occurs during the wet cleaning process is undesirable. Also, the wet cleaning process often varies in quality and thoroughness from session to session because it is manually performed, and this may affect the processes conducted in the chamber.

The chamber may also be cleaned by a dry-cleaning process in which plasma or microwave-activated cleaning gas is provided in the chamber. However, the cleaning gas may be slow at cleaning-off certain types of residue deposits, for example, those which are relatively thick or which have a chemical composition that is hard to clean. As one example, in CVD deposition chambers, a thicker residue deposit may be formed at regions of the chamber which are near the gas inlet nozzles. It is more difficult to clean off the thicker residue deposits without relatively long chamber cleaning downtime, erosion of exposed chamber surfaces at other portions of the chamber, or the use of highly erosive gas chemistries.

Thus, it is desirable to increase the processing efficiency of a gas in a substrate processing chamber, for example, the cleaning efficiency of a cleaning gas. It is further desirable to uniformly remove residues having variable thickness or non-uniform chemical compositions without eroding underlying chamber surfaces.

SUMMARY

The present invention provides an apparatus and method useful in the processing of a substrate in a chamber, for example in cleaning the chamber.

One aspect of the present invention comprises a substrate processing chamber comprising a first gas distributor adapted to provide a process gas into the chamber to process the substrate, a second gas distributor adapted to provide a cleaning gas into the chamber to clean the chamber, and an exhaust to exhaust the process and cleaning gas from the chamber.

In another aspect, a substrate processing chamber comprises first means for providing a process gas into the chamber to process the substrate, second means for providing a cleaning gas into the chamber to clean the chamber, and an exhaust to exhaust the process and cleaning gas from the chamber.

In yet another aspect, a substrate fabrication method comprises processing one or more substrates by (i) placing a substrate in a process zone, (ii) providing a process gas at a first region of the process zone to process the substrate, (iii) exhausting the process gas, (iv) removing the substrate, and (v) optionally, repeating steps (i) through (iv); and providing a cleaning gas at a second region of the process zone to clean a surface therein.

In a further aspect, the present invention comprises an apparatus capable of depositing material on a substrate, the apparatus comprising a deposition chamber having a support to support a substrate, a first gas distributor to provide a deposition gas to the deposition chamber, a plasma generator to form a plasma from the deposition gas to deposit material on the substrate, and an exhaust to exhaust the deposition gas from the deposition chamber; a remote chamber adapted to energize a cleaning gas; and a second gas distributor connecting the remote chamber to the deposition chamber, the second gas distributor adapted to direct a flow of the energized cleaning gas to a region of, or across a surface in, the deposition chamber.

In yet another aspect, a substrate processing apparatus comprises a chamber comprising a support to support a substrate, a first gas distributor to provide a process gas to the chamber, a plasma generator to form a plasma from the process gas to deposit material on the substrate, and an exhaust to exhaust the process gas from the chamber; a remote chamber adapted to energize a cleaning gas; and a second gas distributor connecting the remote chamber to the chamber to introduce the energized cleaning gas at a location that is distal from the exhaust.

In another aspect, a substrate processing method comprises processing one or more substrates by (i) placing a substrate in a process zone, (ii) providing a process gas into the process zone to process the substrate, (iii) exhausting the process gas via an exhaust zone, (iv) removing the substrate from the process zone, and (v) optionally, repeating steps (i) through (iv); and introducing a cleaning gas into the process zone at a location that is distal from the exhaust zone.

In another aspect the present invention comprises a gas distributor capable of distributing a gas in a substrate processing chamber, the gas distributor comprising one or more gas outlets adapted to direct gas preferentially across a surface of the chamber.

DRAWINGS

These and other features, aspects, and advantages of the present invention will be better understood from the following drawings, description and appended claims, which illustrate exemplary features of the invention, however, it is to be understood that each of the features can be used in the invention in general, not merely in the context of the particular drawings, and the invention includes any combination of these features, where:

FIG. 2b is a top view of the gas distributor shown in FIG. 2a; and

DESCRIPTION

Figure 1A:
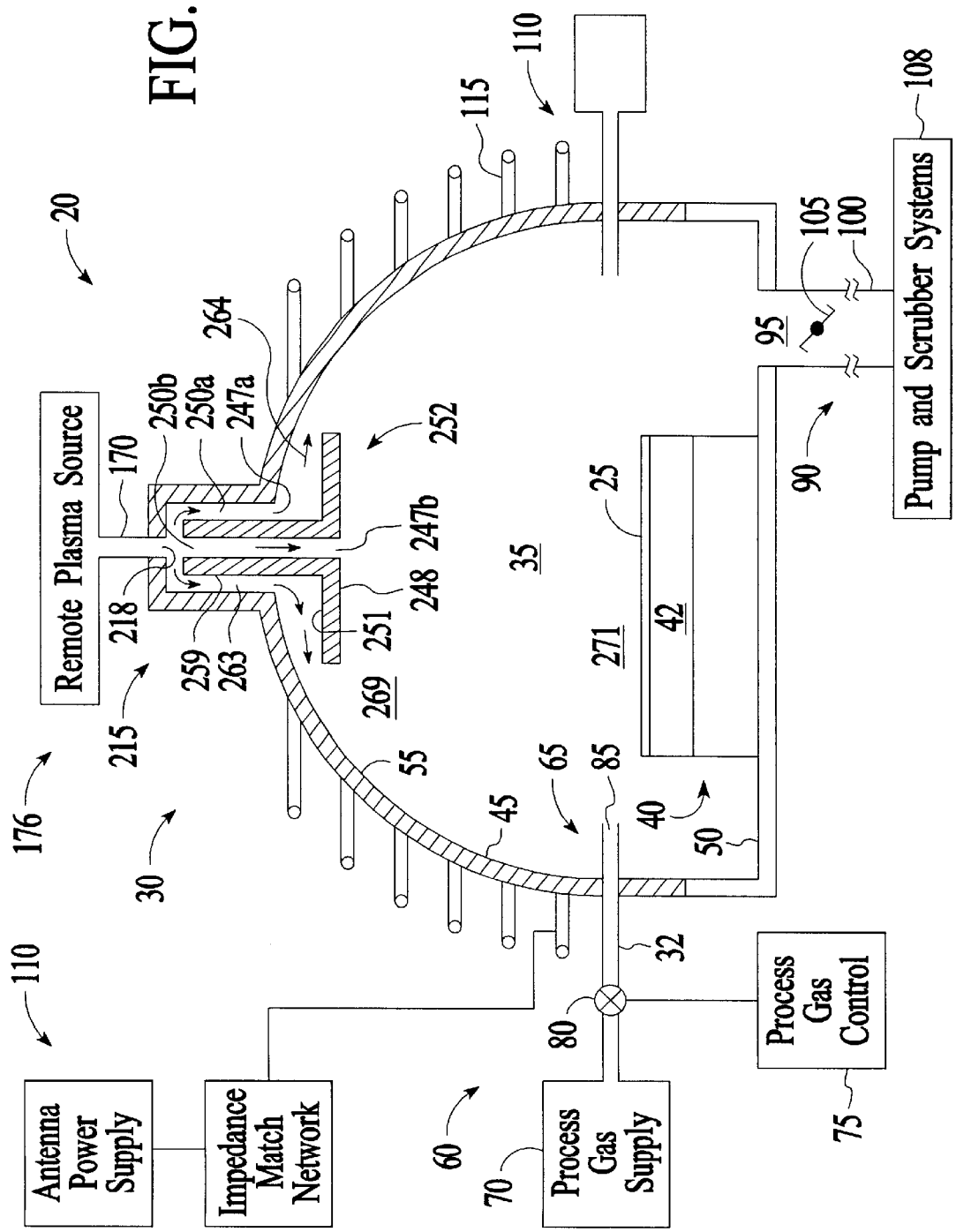
FIG. 1a is a sectional schematic view of an embodiment of an apparatus according to the present invention.

An apparatus 20 according to the present invention is suitable for processing a substrate 25, such as for example, a semiconductor wafer or a flat panel display. An exemplary embodiment of the apparatus 20, as schematically illustrated in FIG. 1a, comprises a process chamber 30 defining a process zone 35 for processing of the substrate 25. The substrate 25 is typically held in the process zone 35 on a support 40, which may include an electrostatic chuck 42 which is chargeable to electrostatically hold the substrate 25. The chamber 30 has sidewalls 45, a bottom wall 50, and a ceiling 55 facing the substrate 25. The chamber 30 may be fabricated from any of a variety of materials including metals, ceramics, glasses, polymers and composite materials. For example, metals commonly used to fabricate the chamber 30 include aluminum, anodized aluminum, "HAYNES 242," "AI-6061," "SS 304," "SS 316," and INCONEL, of which anodized aluminum is used to fabricated a preferred version. The ceiling 55 comprises a flat, rectangular, arcuate, conical, dome or multiradius-arcuate shape as shown in FIG. 1a. The particular embodiment of the apparatus 20 shown herein is suitable for processing of active and passive electronic devices on a substrate 25, and is provided only to illustrate the invention, and should not be used to limit the scope of the invention.

Figure 3:
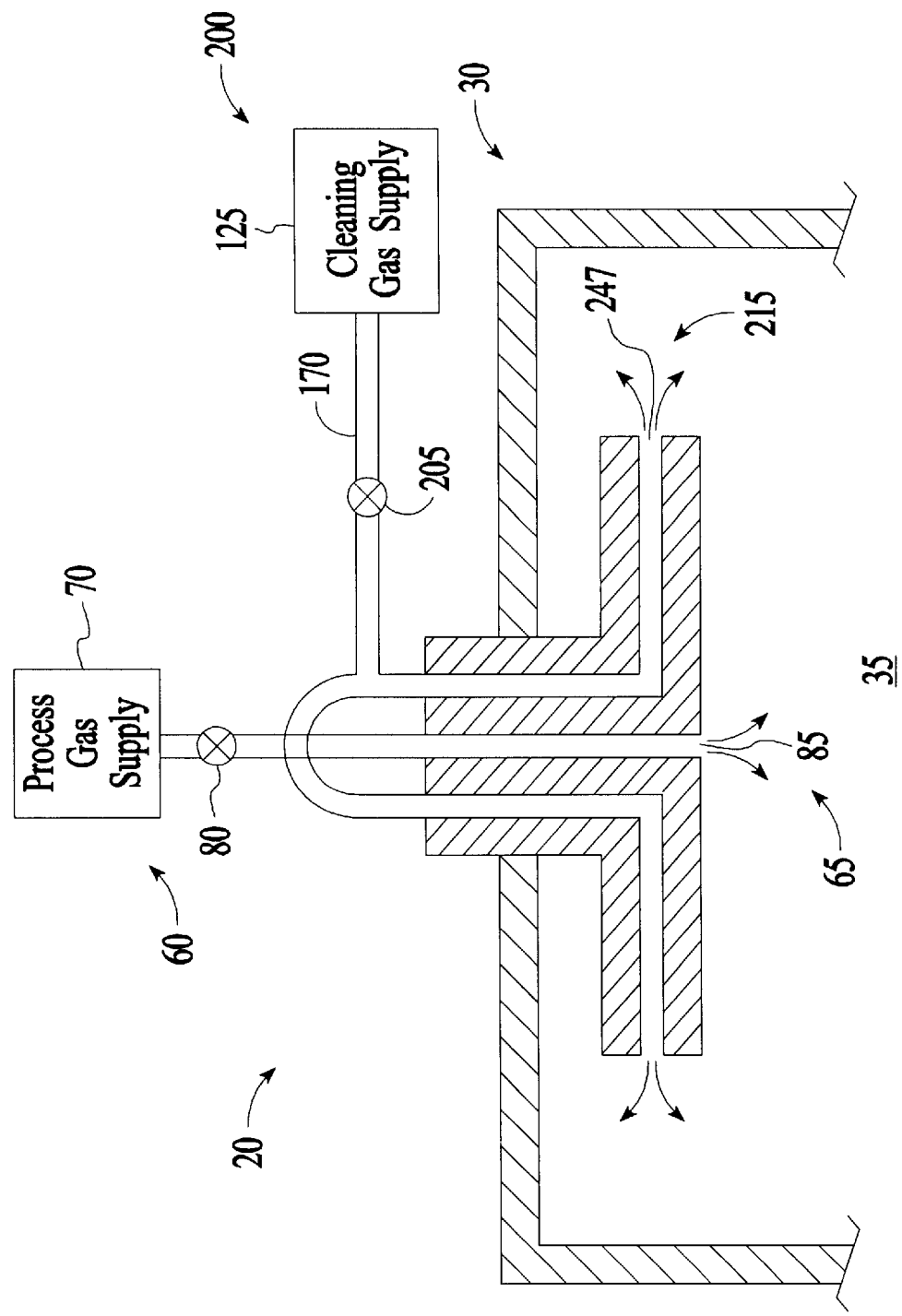
FIG. 3 is a partial sectional schematic view of another embodiment of an apparatus according to the present invention.

The process chamber 30 may be used as a deposition chamber to deposit material on a substrate 25, for example, to deposit a silicon-containing material, such as polysilicon, silicon nitride, silicon oxide or metal silicide; to deposit a metal-containing material, such as aluminum or copper; or to deposit any other material on the substrate 25. Process gas comprising, for example, deposition gas, is introduced into the chamber 30 by a first gas delivery system 60 comprising a gas flow control 75 that operates one or more gas flow meters 80 on a gas feed conduit 82 that can transport a gas, such as a process gas, from a first gas supply 70 to a first gas distributor 65 in the chamber 30. The first gas distributor 65 comprises gas outlets 85 which may be located peripherally around the substrate 25 (as shown in FIG. 1a) or near the ceiling 55 of the chamber 30 (as shown in FIG. 3). The process gas introduced in the chamber 30 is exhausted by an exhaust system 90 that includes an exhaust conduit 95, an exhaust line 100, a throttle valve 105, and pumps and scrubber systems 108 which may include roughing and turbo-molecular pumps. The exhaust conduit 95 is a port or channel that receives the gas provided in the chamber 30 for exhausting the gas, and that is typically positioned around the periphery of the substrate 25. The exhaust line 100 connects the exhaust conduit 95 to the pump and scrubber systems 108, and the throttle valve 105 in the exhaust line 100 may be used to control the pressure of gas in the chamber 30.

A plasma is formed from the process gas introduced into the chamber 30 by a plasma generator 110 that couples electromagnetic energy into the process zone 35 of the chamber 30. A suitable plasma generator 110 comprises an inductor antenna 115 comprising one or more inductor coils covering the ceiling 55 of the chamber 30. In one version, the coils may have a circular symmetry about a central axis of the chamber 30, the arrangement and number of the coils being selected to provide the desired product of current and antenna turns $(d/dt)(N \cdot I)$ near the ceiling 55 to provide a good inductive flux into the plasma. In this version, the ceiling 55 may be made of a dielectric material that is permeable to electromagnetic energy, such as RF energy, for example, silicon or silicon dioxide.

In the processing of substrates 25 according to the present invention, a substrate 25 is transported in the chamber 30 and placed on the support 40. Process gas, such as a deposition gas, may be introduced into the chamber 30 via the first gas distributor 65 and from around a periphery of the substrate 25 to process the substrate. A plasma may be formed from the process gas 70 by energizing the plasma generator 110 to deposit a material on the substrate 25. For example, an insulator or dielectric material, such as for example, $SiO_2$ or $Si_3N_4$, may be formed by chemical vapor deposition (CVD) using a process gas comprising one or more of $SiH_4$, $SiClH_2$, $CO_2$, $H_2$, $N_2O$, $Si(OC_2H_5)_4$, $NH_3$ and $N_2$. Alternatively, a metal-containing material which may comprise an elemental metal, metal compound or a metal alloy, may also be formed in the deposition chamber. For example, a tungsten-containing material may be deposited using a process gas comprising one or more of $WF_6$, $H_2$ and $SiH_4$; a molybdenum-containing material may be formed using, for example, process gas comprising $MoCl_5$ and $H_2$; and an aluminum-containing material may be formed using, for example, $AlCl_3$ or $Al(CH_3)_3$ mixed with Ar or $H_2$ or both. Thereafter, the substrate 25 is removed and another substrate 25 may be provided in the chamber for processing.

Figure 1B:
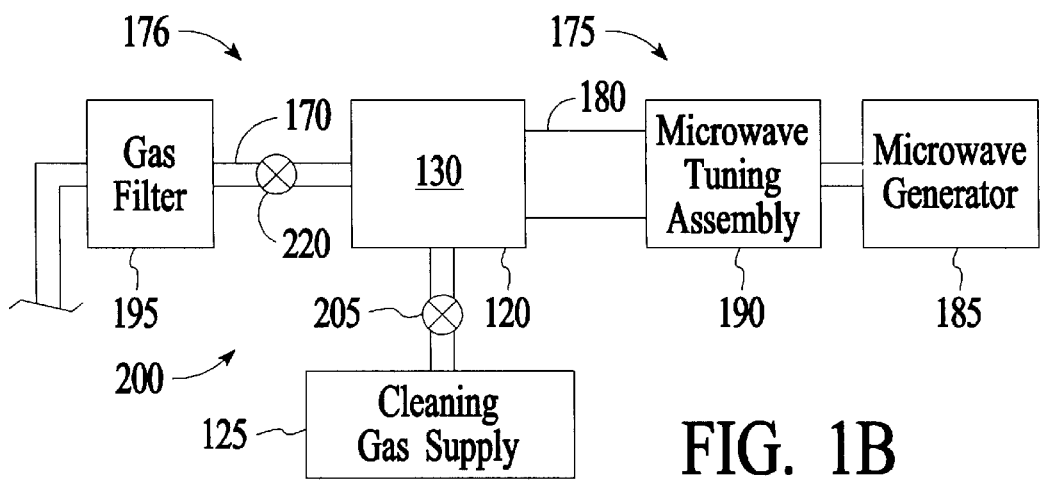
FIG. 1b is a sectional schematic view of an embodiment of a remote plasma source.
Figure 1C:
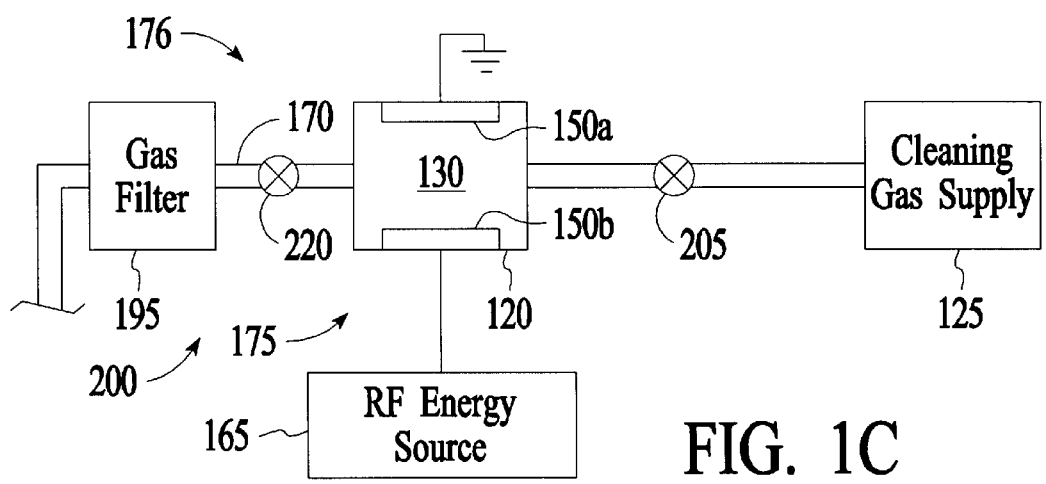
FIG. 1c is a sectional schematic view of yet another embodiment of a remote plasma source.

Optionally, the apparatus 20 may further comprise a remote plasma source 176 comprising a remote chamber 120, such as a quartz tube, that is supplied with a cleaning gas from a cleaning gas supply 125, as illustrated in FIGS. 1b through 1c. The remote chamber 120 is upstream from the process chamber 30 and comprises a remote zone 130 in which a cleaning gas may be energized using a gas energizer 175 that couples electromagnetic energy, such as microwave or RF energy, to the cleaning gas. In one embodiment, as schematically illustrated in FIG. 1b, the gas energizer 175 comprises a microwave waveguide 180 that transmits microwaves that are generated by a microwave generator 185 and tuned by a microwave tuning assembly 190.

The cleaning gas supplied to the remote chamber 120 may comprise, for example, a fluorine-containing gas, such as one or more of $NF_3$, $C_2F_6$, $C_3$, $F_8$, $CF_4$ and $SF_6$. When electromagnetic energy is applied to the cleaning gas, it may dissociate to form species that clean the process residues deposited on surfaces in the chamber 30. For example, chlorine-containing gas, such as $Cl_2$, may dissociate under the application of electromagnetic energy to form atom chlorine; and fluorine-containing gas, such as $F_2$, may dissociate to form atomic fluorine. The dissociated or ionized species clean off process residues formed on the surfaces in the process chamber 30 when one or more substrates 25 are processed in the chamber 30.

Figure 1D:
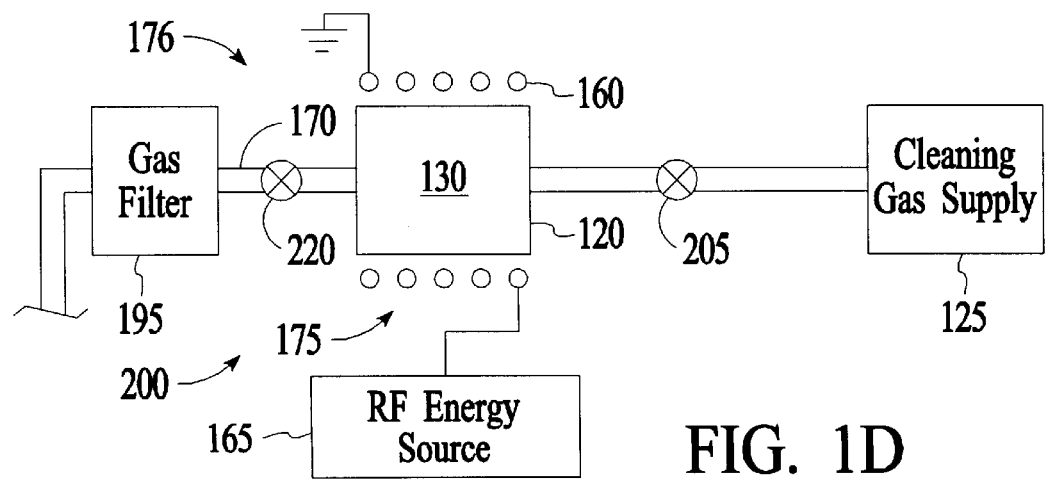
FIG. 1d is a sectional schematic view of yet another embodiment of a remote plasma source.

Instead of or in addition to using microwaves, the cleaning gas may also be activated by RF energy. The RF energy may be applied to the cleaning gas by inductive or capacitive coupling. For example, as illustrated in FIG. 1c, a suitable RF gas energizer 175 comprises a pair of electrodes 150a,b positioned within the remote chamber 120 to provide a capacitively coupled field in the chamber 120. As another example, as illustrated in FIG. 1d, the RF gas energizer 175 may comprise an inductor antenna 160 comprising a coil wrapped around the remote chamber 120. The RF gas energizers 175 are powered by a suitable RF energy source 165.

Optionally, the remote chamber 120 is located a relatively short distance upstream from the process chamber 30. This version may allow the cleaning gas to provide a higher concentration of dissociated species to the process chamber for cleaning of the chamber 30. Typically, some of the dissociated species may recombine during travel from the remote chamber 120 to the process chamber 30, however, a shorter distance upstream may reduce such recombination effects. Thus, in one version of the invention, the remote chamber 120 is located a distance of less than about 50 cm upstream of the chamber 30, or may even be located a distance of less than about 20 cm upstream. The upstream distance is determined by the composition of the cleaning gas, the energy applied to the gas energizer 175 in the remote chamber 120, and the nature of the process residues being removed from the chamber 30. Thus, other distances may be more appropriate for different chamber configurations, gas compositions, or process residue compositions.

A second gas delivery system 200 delivers cleaning gas that is energized in the remote chamber 120 to the process chamber 30 to clean the chamber 30. In one version, the second gas delivery system 200 comprises a conduit 170 that connects the remote chamber 120 to the process chamber 30, with optionally, one or more gas flow meters 205, 220 to control the flow of cleaning gas through the conduit 170, as illustrated in FIGS. 1b through 1c. A filter 195 may also be positioned in the conduit 170 to remove any particulate matter that may be formed while energizing the cleaning gas. In one embodiment, the filter 195 is made of a porous ceramic material, however, other materials can also be used, such as for example, Teflon™ DuPont de Nemours, Inc., polyimide, inactivated carbon or sulphur.

The second gas delivery system 200 further comprises a second gas distributor 215 having an inlet 218 for receiving the cleaning gas energized in the remote chamber 120 and one or more outlets 247a,b for distributing the energized cleaning gas in the process chamber 30, as illustrated in FIG. 1a. In one version, the cleaning gas distributor 215 directs a flow of the cleaning gas in one or more regions of, or across surfaces of, the chamber 30. The chamber regions typically have, for example, higher concentrations or thicker deposits of process residues, more difficult to clean process residues, or where excessive accumulation of process residues is harmful for subsequent wafer processing steps, for example, because the residues can flake off and contaminate the substrate 25. The chamber surfaces may include, for example, a surface of one of the chamber walls 45, 50 or ceiling 55, or the surface of a component in the chamber 30, such as for example, a surface of the support 40. After a single substrate 25 or a batch of substrates 25 are processed in the chamber 30, cleaning gas is passed into the chamber 30 to clean the process residues that may have formed on the chamber surfaces during the deposition process. The cleaning gas is introduced into the remote chamber 120 and the gas energizer 175 energized to energize the cleaning gas by, for example, dissociating the gas. The energized cleaning gas is then directed by the cleaning gas distributor 215 into a predefined region or against a preselected surface of the chamber 30 to efficiently clean the process residues at these regions or surfaces, while minimizing erosion of the chamber 30 at other regions and surfaces.

For example, as shown in FIG. 1a, the cleaning gas distributor 215 may preferentially direct the flow of the cleaning gas across the chamber surface facing the substrate 25, for example, the ceiling 55 of the chamber 30. The directed cleaning gas flows past the ceiling 55 to clean the process residues formed thereon. In deposition processes, process residues comprising chemical or physical vapor deposition species can form on the ceiling 55 when the ceiling is close to the process gas nozzles 85, or when other process characteristics, such as chamber geometry, gas composition, or plasma sheath properties, cause the residues to form more readily on the ceiling 55. As a result, the ceiling 55 can develop a higher concentration, higher thickness, or more difficult to remove process residue composition than that formed at other surfaces of the chamber 30. The cleaning gas spreads across the ceiling 55 to preferentially clean the ceiling 55, and this reduces erosion of other chamber surfaces underlying process deposits that may be thinner or be more difficult to clean.

In one version, the second gas distributor 215 comprises a surface topography that is adapted to spread the cleaning gas preferentially across a predefined surface of the chamber 30. For example, in the version shown in FIG. 1a, the second gas distributor 215 comprises a T-shaped member 252 comprising a tubular post 259 sized to fit into a recessed portion 263 of the chamber 30, and a baffle 248 extending from the tubular post 259 outside the recessed portion 263. The tubular post 259 may be joined to the baffle 248 by welding or an adhesive, or the two may be a single unit. The tubular post 259 may comprise or define one or more conduits 250a,b through which cleaning gas may flow into the chamber 30. The energized cleaning gas enters the T-shaped member 252 from a gas inlet 218 and travels through the gas conduits 250a,b to one or more gas outlets 247a,b that terminate in the upper region of the chamber 30 near the ceiling 55.

The baffle 248 of the second gas distributor 215 comprises a surface 251 adapted to direct cleaning gas preferentially across the ceiling 55 of the chamber 30 in the upper region 269 of the chamber 30 to pre-selected regions of the process chamber 30 where the cleaning of process residue is needed, for example where process residues are thick or chemically hard or are particularly damaging to chamber components. For example, the baffle 248 may be positioned so that the cleaning gas flowing out of the outlet 247a is directed by the baffle surface 251 across the surface of the ceiling 55, as shown by the arrow 267. The baffle surface 251 may have a topography that is, for example, substantially planar, ridged, concave or convex shaped. In the version shown, the baffle 248 comprises a disc-shaped platen having a central axis that is aligned about an axis of the chamber. The baffle may comprise a platen which extends outwardly from the tubular post 259 and horizontally across the surface 55 such that the upper baffle surface 251 is parallel to the substrate 25. Alternatively, the angle made between the upper surface 251 and the substrate 25 may be set such that the angle is greater than or less than 90°. The angle should be chosen such that the deflection of the gas off of the upper surface 251 will direct it to the pre-selected regions or surfaces. Additionally, the radius of the baffle 248 and the distance the tubular post 249 extends into the chamber 30 can be chosen such that the gas is directed to the pre-selected regions or surfaces. For example, a gas distributor 215 with a baffle 248 having a larger radius and a longer tubular post that extends further into the chamber 30 may be preferred to clean the lower regions 271 of the process chamber.

In the version shown in FIG. 1a, the cleaning gas is introduced into the chamber 30 along a bifurcated pathway, with a portion of the gas entering the upper chamber region 269 after passing through the conduit 250b and exiting from the gas outlet 247b, and another portion of the gas passing thorough the conduit 250a exiting from the gas outlet 247a and being directed by the baffle 248 along the surface of the chamber ceiling 55. The conduit 250b is in the tubular post 259. The inner wall of the conduit 250a is formed by the exterior surface of the tubular post 249 while the outer wall of the conduit 250a is formed by the wall of the recessed portion 263.

Figure 2A:
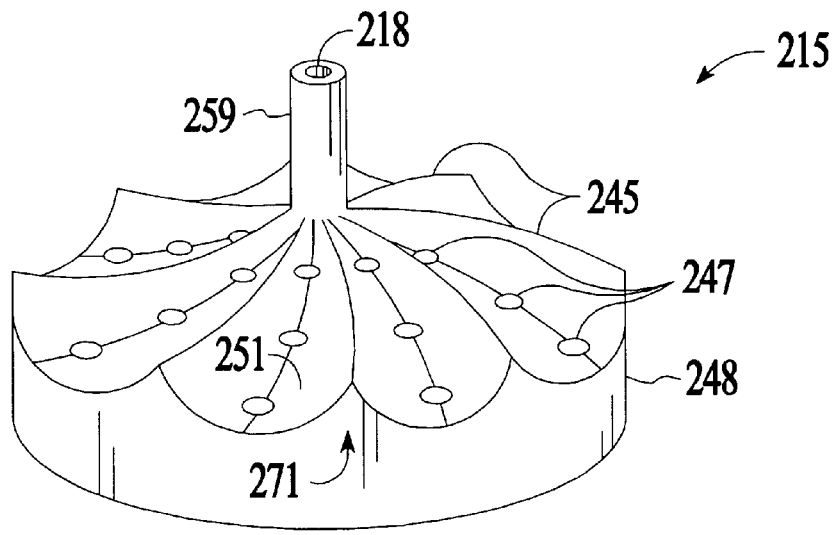
FIG. 2a is a perspective view of another embodiment of a gas distributor according to the present invention.
Figure 2B:
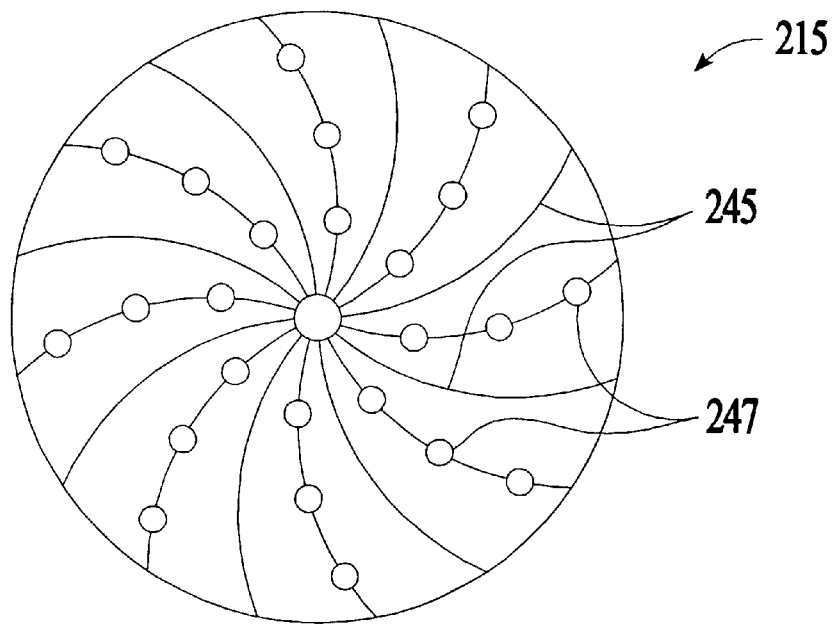

FIGS. 2a and 2b show yet another version of the gas distributor 215 which is also adapted to spread the cleaning gas preferentially in a region of, or across a surface in, the chamber 30. In this version, the second gas distributor 215 comprises one or more gas outlets 247 between ridges 245. The ridges 245 are shaped and sized, and the gas outlets 247 positioned between them, so that the surfaces 251 direct a fresh flow of cleaning gas past preselected chamber surfaces. In one version, the ridges 245 are arranged in a spiraling pattern having arcuate prongs 271 that originate from the center of the gas distributor 215 and curve radially outwardly as they extend across the surface of the gas distributor 215. This arrangement of the ridges 245 flows the cleaning gas in a radially outward pattern. The gas outlets 247 may also be placed at the apex of concave surfaces 251 defined by the ridges 245 to direct the cleaning gas along a spirally shaped flow path past the chamber surfaces. In this version, the cleaning gas 70 flows upward along the concave surfaces 251 between the ridges 245 to impinge upon, and circulate along the surface of the ceiling 55.

In another embodiment, the cleaning gas is directed across a surface 55 of the chamber 30 that is heated, directly or indirectly, to a temperature that is sufficiently high to promote reaction of the cleaning gas with the process residues deposited on the surface 55. In this version, for example, a plasma generated in the chamber 30 may cause certain surfaces in the chamber 30 to heat up. The temperatures reached by the surface 55 are may depend upon the temperature of the plasma adjacent the surface 55, or the power applied to a heater adjacent the surface 55 or directing heat on the surface, such as a lamp (not shown), and may exceed about 200° C. Passing the cleaning gas across the hot surface promotes reaction of the fresh cleaning gas with the heated process residues on the surface, thereby readily removing the process residues.

Optionally, the gas distributor 215 may be positioned at a location in the chamber 30 that is distal from the exhaust conduit 95 to further extend the passage of the cleaning gas across the chamber surfaces before the exhaust gas is withdrawn from the chamber 30. In one version, the gas outlets 247 of the gas distributor 215 are located so that the cleaning gas is introduced into the chamber 30 at a location that is at least 10 cm away from the exhaust conduit 95 to provide a sufficient distance for the cleaning gas to travel before it is exhausted from the chamber 30. Premature exhausting of the cleaning gas may result in uneven cleaning of process residues formed on the chamber surfaces. Also, since the exhaust 90 is far from the cleaning gas distributor 215, a greater surface area of the chamber 30 is exposed to the cleaning gas and for a longer period of time. This allows the cleaning gas to spread through the chamber 30 and clean the chamber surfaces before it is exhausted.

In yet another version, the first and second gas distributors 65, 215 are combined in a single structure, as illustrated in FIG. 3, that delivers process gas to the chamber 30 via first gas outlets 85 and delivers cleaning gas to the chamber 30 via second gas outlets 247. This version is advantageous when it is desirable to locate both the process gas outlets 85 and the cleaning gas outlets 247 near each other in the chamber 30. For example, when it is desirable to introduce both the process gas and cleaning gas from above the substrate 25.

In an exemplary process according to the present invention, a material such as $SiO_2$ may be deposited on a substrate 25 comprising a silicon wafer in an apparatus 20 according to the present invention. The deposition gas comprises, for example, a gases such as $SiH_4$ which is introduced into a deposition process zone 35 containing a substrate 25. A plasma is formed from the deposition gas 70 to deposit $SiO_2$ material on the substrate 25. The deposition gas is then exhausted from the chamber 30 through the exhaust zone. The substrate 25 is then removed from the chamber 30. Optionally, these steps may be repeated using other substrates to process a batch of substrates. There after, an energized cleaning gas is directed preferentially across a surface in the process zone 35 that is for example the ceiling 55, to remove the process residues formed thereon. The cleaning gas may be comprise, for example, $NF_3$, $C_3F_8$, $C_2F_6$, $CF_4$ and $SF_6$ and the gas may be energized by powering the microwave generator at a power level of about 3000 Watts.

An apparatus and process according to the present invention are advantageous, for example, because they are capable of maximizing reaction efficiency between the energized cleaning gas and the process residues formed in the chamber 30. Thick or chemically hard process residues, especially the residues formed in deposition processes, such as CVD processes, may be effectively removed. Prior art cleaning processes, particularly those performed by an operator, often failed to uniformly clean the process residues formed on chamber surfaces and the accumulated process residues would flake-off and contaminate the substrate 25. However, by cleaning off the accumulated process residues, the yields from the substrate 25 may be substantially improved. In addition, applying the energized cleaning gas to predefined regions of the chamber may result in less erosive damage to other chamber surfaces, for example, those underlying thinner process residues or those without any process residue deposits—compared to conventional cleaning processes in which more corrosive gases or higher gas energizing power levels are used to remove the thicker process residues. By reducing the need to often replace the chamber 30 or its components, the cost of operating the chamber 30 may also be significantly reduced.

The present invention has been described with reference to certain preferred versions thereof; however, other versions are possible. For example, the apparatus 20 or cleaning process of the present invention can be used for forming different materials on other substrates 25, or for treating chambers for other applications, as would be apparent to one of ordinary skill. For example, the process can be applied to treat sputtering chambers, ion implantation chambers, etch chambers with organic or polymeric residue, or other deposition chambers, or which may be applied in combination with other types of cleaning processes. Therefore, the spirit and scope of the appended claims should not be limited to the description of the preferred versions contained herein.

What is claimed is:

1. A substrate processing chamber comprising a sidewall and a ceiling, a first gas distributor adapted to provide a process gas into the chamber to process a substrate, a second gas distributor comprising an inlet adapted to receive a remotely energized cleaning gas and an outlet adapted to direct the remotely energized cleaning gas preferentially across a surface of one or more of the sidewall and ceiling in the chamber to clean the surface, and an exhaust to exhaust one or more of the process gas and cleaning gas from the chamber.

2. A chamber according to claim 1 wherein the outlet of the second gas distributor is about an outlet of the first gas distributor.

3. A chamber according to claim 1 wherein the second gas distributor is adapted to direct the remotely energized cleaning gas across a surface of a chamber component.

4. A chamber according to claim 3 wherein the second gas distributor is adapted to spread the remotely energized cleaning gas across the surface.

5. A chamber according to claim 3 wherein the surface is adapted to face a substrate.

6. A chamber according to claim 3 wherein the surface is heated to a temperature of at least about 200° C. during processing of a substrate in the chamber.

7. A chamber according to claim 1 wherein the second gas distributor comprises a baffle.

8. A chamber according to claim 7 wherein the second gas distributor comprises one or more gas outlets disposed to provide the remotely energized cleaning gas into the chamber so that the flow of the remotely energized cleaning gas may be directed by the baffle.

9. A chamber according to claim 7 wherein the baffle comprises a plurality of ridges.

10. A chamber according to claim 9 wherein the baffle comprises one or more gas outlets between the ridges.

11. A chamber according to claim 1 further comprising a remote chamber comprising a gas energizer adapted to energize cleaning gas prior to introducing the remotely energized cleaning gas into the chamber.

12. A chamber according to claim 11 wherein the remote chamber is upstream of a process zone a distance of less than about 50 cm.

13. A chamber according to claim 1 wherein the exhaust comprises an exhaust conduit, and wherein the second gas distributor comprises one or more gas outlets distal from the exhaust conduit.

14. A chamber according to claim 13 wherein the gas outlets are at least about 10 cm from the exhaust conduit.

15. A chamber according to claim 1 wherein the first gas distributor comprises one or more gas outlets around a periphery of a substrate support.

16. A substrate processing chamber according to claim 1 further comprising a substrate support capable of supporting the substrate, and a gas energizer to energize one or more of the process gas and cleaning gas.

17. A substrate processing chamber having a sidewall and a ceiling, the chamber comprising:
    first means for providing a process gas into the chamber to process the substrate;
    second means for energizing and directing a cleaning gas preferentially across a surface of one or more of the sidewall and ceiling in the chamber to clean the surface; and
    an exhaust to exhaust one or more of the process gas and cleaning gas from the chamber.

18. A chamber according to claim 17 wherein the second means comprises an outlet about an outlet of the first means.

19. A chamber according to claim 17 wherein the second means is adapted to spread the cleaning gas across the surface.

20. A chamber according to claim 17 wherein the second means comprises a remote chamber that is upstream of a process zone in the chamber, and a gas energizer to energize the cleaning gas in the remote chamber.

21. A chamber according to claim 17 wherein the exhaust comprises an exhaust conduit, and wherein the second means provides the cleaning gas at a location distal from the exhaust conduit.

22. A substrate processing chamber according to claim 17 further comprising a substrate support capable of supporting the substrate, and a gas energizer to energize one or more of the process gas and cleaning gas.

23. An apparatus capable of depositing material on a substrate, the apparatus comprising:
    a deposition chamber having a sidewall, a ceiling, a support to support a substrate, a first gas distributor to provide a deposition gas to the deposition chamber, a plasma generator to form a plasma from the deposition gas to deposit material on the substrate, and an exhaust to exhaust gas from the deposition chamber;
    a remote chamber adapted to energize a cleaning gas; and
    a second gas distributor connecting the remote chamber to the deposition chamber, the second gas distributor adapted to direct a flow of the energized cleaning gas preferentially across a surface of one or more of the sidewall and ceiling in the deposition chamber.

24. An apparatus according to claim 23 wherein the second gas distributor comprises an outlet about an outlet of the first gas distributor.

25. An apparatus according to claim 23 wherein the second gas distributor is adapted to spread the cleaning gas flow across the surface.

26. An apparatus according to claim 23 wherein the second gas distributor comprises a baffle.

27. An apparatus according to claim 26 wherein the second gas distributor comprises one or more gas outlets disposed to provide cleaning gas into the chamber so that the flow of the cleaning gas may be directed by the baffle.

28. An apparatus according to claim 26 wherein the baffle comprises a plurality of ridges.

29. An apparatus according to claim 28 wherein the baffle comprises one or more gas outlets between the ridges.

30. An apparatus according to claim 23 wherein the surface at least partially faces the support.

31. An apparatus according to claim 23 wherein the surface is heated to a temperature of at least about 200° C. during processing of a substrate in the chamber.

32. An apparatus according to claim 23 wherein the exhaust comprises and exhaust conduit, and wherein the second gas distributor comprises second gas outlets that are distal from the exhaust conduit.

33. A substrate processing chamber according to claim 23 wherein the remote chamber comprises a gas energizer to energize the cleaning gas.

34. A substrate processing apparatus comprising:
    a substrate processing chamber comprising a sidewall, a ceiling, a support to support a substrate, a first gas distributor to provide a process gas to the substrate processing chamber, a plasma generator to form a plasma from the process gas to process the substrate, and an exhaust to exhaust gas from the substrate processing chamber;
    a remote chamber adapted to energize a cleaning gas; and
    a second gas distributor connecting the remote chamber to the substrate processing chamber to introduce the energized cleaning gas at a location that is distal from the exhaust and direct the cleaning gas preferentially across a surface of one or more of the sidewall and ceiling in the substrate processing chamber.

35. An apparatus according to claim 34 wherein the first gas distributor comprises one or more first gas outlets around a periphery of the support and the second gas distributor comprises one or more second gas outlets above the support.

36. An apparatus according to claim 34 wherein the exhaust comprises an exhaust conduit, and wherein one or more second gas distributor outlets are at least about 10 cm from the exhaust conduit.

37. An apparatus according to claim 34 wherein the second gas distributor is adapted to spread the cleaning gas across the surface.

38. An apparatus according to claim 34 wherein the second gas distributor comprises a baffle.

39. An apparatus according to claim 38 wherein the second gas distributor comprises one or more gas outlets disposed to provide cleaning gas into the substrate processing chamber so that the flow of the cleaning gas may be directed by the baffle.

40. A substrate processing chamber according to claim 34 wherein the remote chamber comprises a gas energizer to energize the cleaning gas.

41. A gas distributor capable of distributing a gas in a substrate processing chamber, the gas distributor comprising an inlet for receiving a remotely energized cleaning gas and one or more gas outlets adapted to direct the remotely energized cleaning gas preferentially across a surface of one or more of a sidewall or a ceiling in the chamber to clean the surface.

42. A gas distributor according to claim 41 wherein the gas distributor comprises a baffle.

43. A gas distributor according to claim 41 wherein the gas distributor comprises one or more outlets disposed to provide remotely energized cleaning gas into the chamber so that the flow of the remotely energized cleaning gas may be directed by the baffle.

44. A gas distributor according to claim 43 wherein the baffle comprises a plurality of ridges.

45. A gas distributor according to claim 44 wherein the baffle comprises one or more gas outlets between the ridges.

46. A substrate processing chamber having a sidewall and a ceiling, the chamber comprising:
a first gas distributor adapted to provide a process gas into the chamber to process a substrate;
a second gas distributor comprising an inlet adapted to receive a remotely energized cleaning gas, a gas outlet, and a baffle, wherein the gas outlet and baffle cooperate to direct the remotely energized cleaning gas preferentially across a surface of one or more of the sidewall or ceiling in the chamber to clean the surface; and
an exhaust to exhaust one or more of the process gas and cleaning gas from the chamber.

47. A substrate processing chamber according to claim 46 wherein the baffle comprises a surface topography adapted to spread the remotely energized cleaning gas preferentially across a predefined portion of a ceiling of the chamber.

48. A substrate processing chamber according to claim 47 wherein the baffle has a surface topography that is substantially ridged, concave, or convex shaped.

49. A substrate processing chamber according to claim 46 wherein the baffle comprises a disc-shaped platen, and wherein the gas outlets are on the platen.

50. A substrate processing chamber according to claim 49 wherein the platen comprises ridges and wherein the gas outlets are between the ridges.

51. A substrate processing chamber according to claim 50 wherein the ridges comprise arcuate prongs.

52. A substrate processing chamber according to claim 51 wherein the arcuate prongs are arranged in a spiraling pattern.

53. A substrate processing chamber according to claim 46 further comprising a substrate support capable of supporting a substrate, and a gas energizer to energize one or more of the process gas and cleaning gas.

54. A substrate processing chamber comprising:
a sidewall, a ceiling and a substrate support capable of supporting a substrate;
a gas distributor adapted to provide a remotely energized gas into the chamber, the gas distributor comprising a gas inlet adapted to receive the remotely energized gas, a baffle having a substantially ridged surface, and gas outlets on the substantially ridged surface, wherein the substantially ridged surface and gas outlets cooperate to direct the remotely energized gas preferentially across a surface of one or more of the sidewall or ceiling in the chamber;
a gas energizer to form the remotely energized gas; and
an exhaust to exhaust the gas.

55. A substrate processing chamber according to claim 54 wherein the substantially ridged surface comprises arcuate prongs.

56. A substrate processing chamber according to claim 55 wherein the arcuate prongs are arranged in a spiraling pattern.

57. A substrate processing chamber according to claim 55 wherein the gas outlets are between the arcuate prongs.

58. A substrate processing chamber according to claim 55 wherein the baffle comprises a disc-shaped platen.

59. A substrate processing chamber comprising:
a sidewall, a ceiling and a substrate support capable of supporting a substrate;
a gas distributor adapted to provide a remotely energized gas into the chamber, the gas distributor comprising a gas inlet adapted to receive the remotely energized gas, and arcuate prongs having gas outlets therebetween, wherein the arcuate prongs and gas outlets cooperate to direct the remotely energized gas preferentially across a surface of one or more of the sidewall or ceiling in the chamber;
a gas energizer to form the remotely energized gas; and
an exhaust to exhaust the gas.

60. A substrate processing chamber according to claim 59 wherein the arcuate prongs are arranged in a spiraling pattern.

61. A substrate processing chamber according to claim 59 wherein the arcuate prongs are mounted on a disc-shaped platen.

* * * * *